United States Patent
Kura et al.

(10) Patent No.: US 12,052,923 B2
(45) Date of Patent: Jul. 30, 2024

(54) PIEZOELECTRIC ACTUATOR AND METHOD OF MANUFACTURING PIEZOELECTRIC ACTUATOR

(71) Applicant: Brother Kogyo Kabushiki Kaisha, Aichi-Ken (JP)

(72) Inventors: Keiji Kura, Chita (JP); Takashi Aiba, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 743 days.

(21) Appl. No.: 17/186,576

(22) Filed: Feb. 26, 2021

(65) Prior Publication Data
US 2021/0305486 A1    Sep. 30, 2021

(30) Foreign Application Priority Data

Mar. 30, 2020    (JP) ................................ 2020-059486

(51) Int. Cl.
| | | |
|---|---|---|
| H01L 41/09 | (2006.01) | |
| H10N 30/05 | (2023.01) | |
| H10N 30/20 | (2023.01) | |
| H10N 30/50 | (2023.01) | |
| H10N 30/87 | (2023.01) | |

(52) U.S. Cl.
CPC ......... *H10N 30/2047* (2023.02); *H10N 30/05* (2023.02); *H10N 30/50* (2023.02); *H10N 30/872* (2023.02)

(58) Field of Classification Search
CPC ... H10N 30/2047; H10N 30/50; H10N 30/872

USPC ........................................................ 310/328
See application file for complete search history.

(56) References Cited

U.S. PATENT DOCUMENTS

| | | | |
|---|---|---|---|
| 2005/0068380 | A1 | 3/2005 | Ito |
| 2006/0082618 | A1 | 4/2006 | Ito |
| 2010/0020465 | A1 | 1/2010 | Fukudome |
| 2010/0223768 | A1 | 9/2010 | Sekiguchi et al. |
| 2013/0084199 | A1* | 4/2013 | Tanaka ................ B41J 2/14209 29/25.35 |

FOREIGN PATENT DOCUMENTS

| | | |
|---|---|---|
| JP | 2005-096350 A | 4/2005 |
| JP | 2006-110824 A | 4/2006 |

(Continued)

OTHER PUBLICATIONS

Dec. 5, 2023—(JP) Notice of Reasons for Refusal—App 2020-059486.
May 14, 2024—(JP) Notice of Reasons for Refusal—App 2020-059486, Eng Tran.

*Primary Examiner* — Derek J Rosenau
(74) *Attorney, Agent, or Firm* — Banner & Witcoff, Ltd.

(57) ABSTRACT

A piezoelectric actuator includes a first piezoelectric layer and a first electrode layer disposed on a surface of the first piezoelectric layer. The first electrode layer includes a trunk portion and a plurality of brunch portions branched from the trunk portion. The trunk portion includes a plurality of junction points from each of which a corresponding branch portion of the plurality of branch portions is branched, an end spaced from the plurality of junction points, and a first through hole positioned between the plurality of junction points and the end of the trunk portion. A first mark is positioned inside the first through hole.

12 Claims, 13 Drawing Sheets

(56) References Cited

FOREIGN PATENT DOCUMENTS

| | | |
|---|---|---|
| JP | 2007-130788 A | 5/2007 |
| JP | 2010-027899 A | 2/2010 |
| JP | 2010-201849 A | 9/2010 |
| JP | 2011-054593 A | 3/2011 |
| JP | 2013-077754 A | 4/2013 |
| JP | 2018-034474 A | 3/2018 |

* cited by examiner

FIG. 3
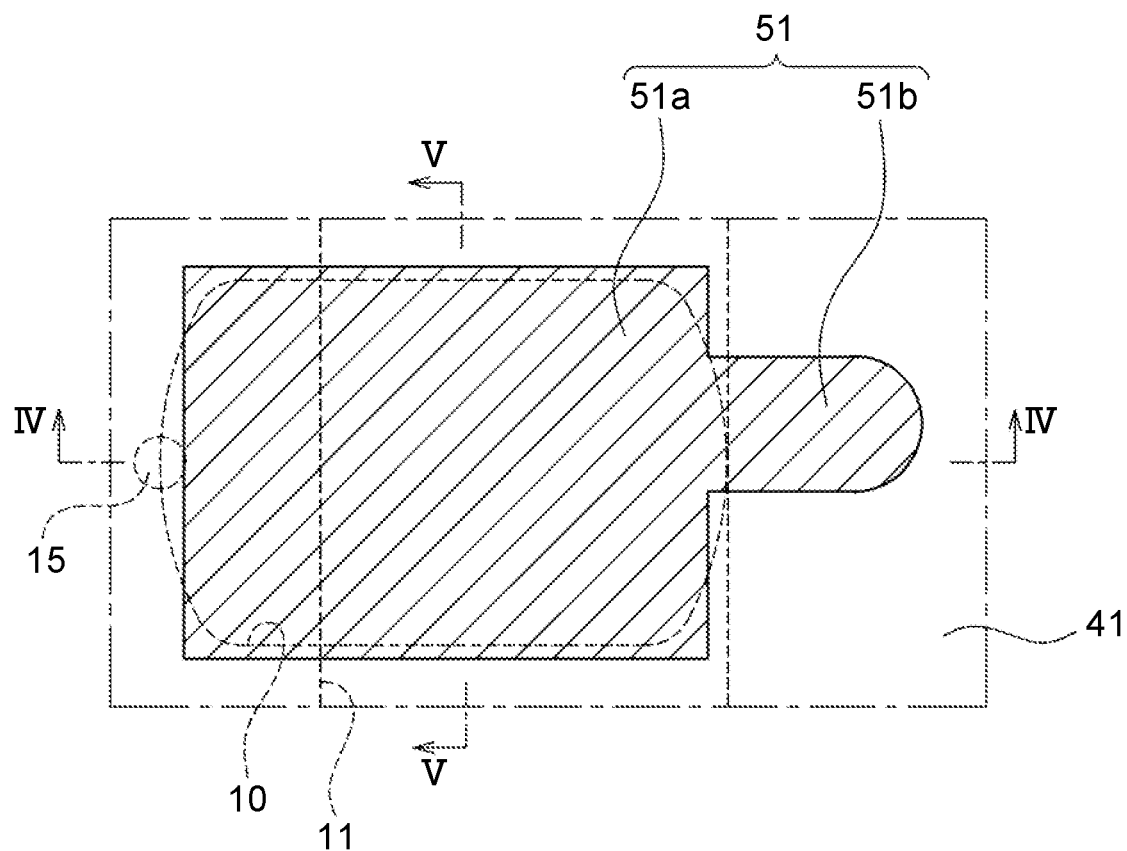
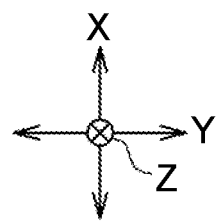

FIG. 5
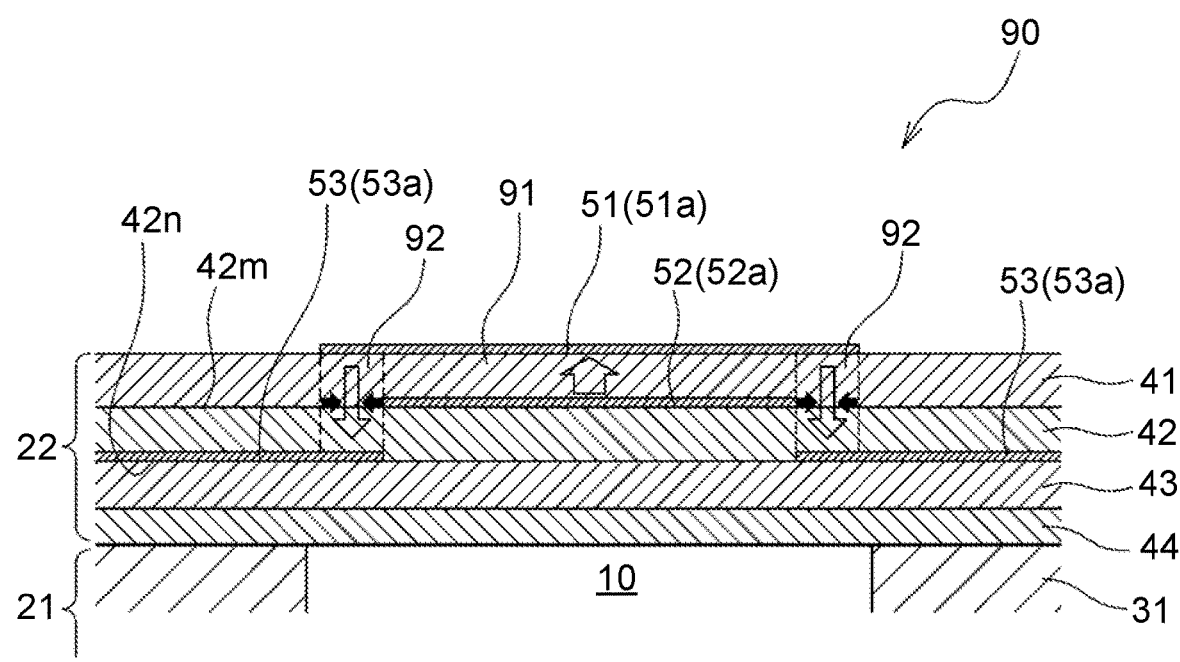
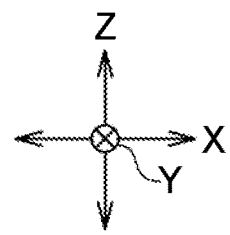

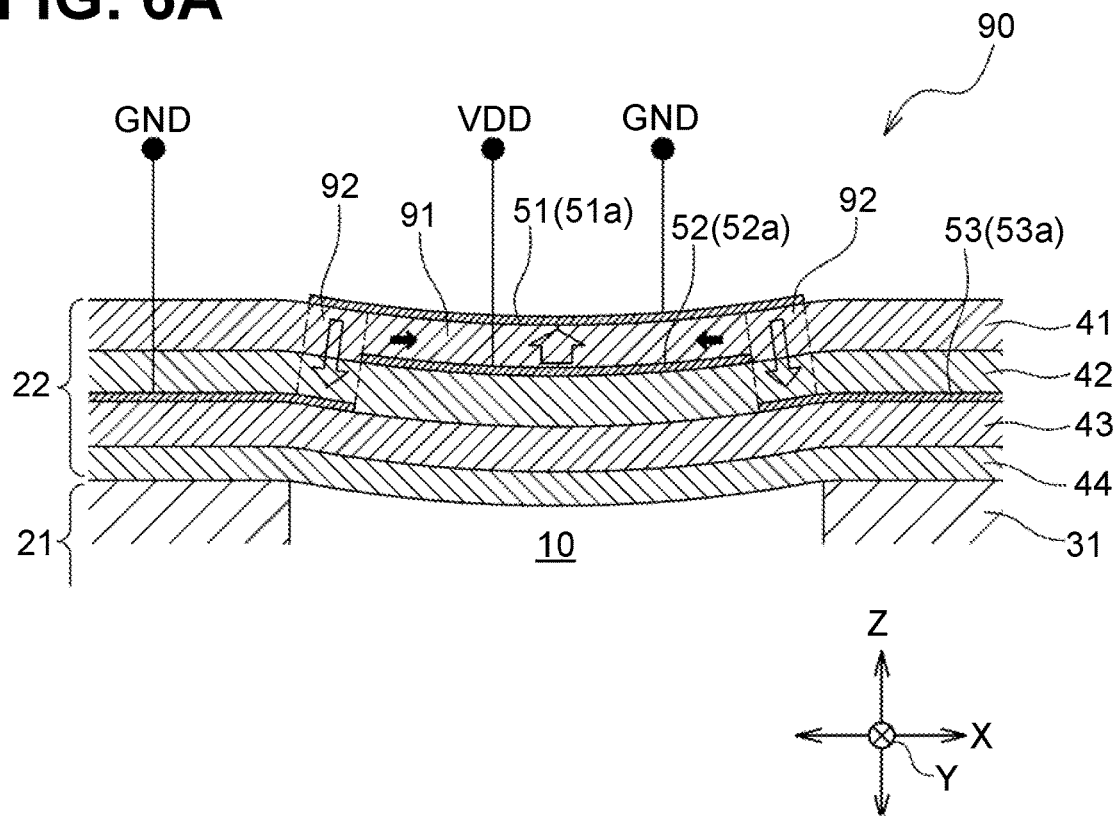
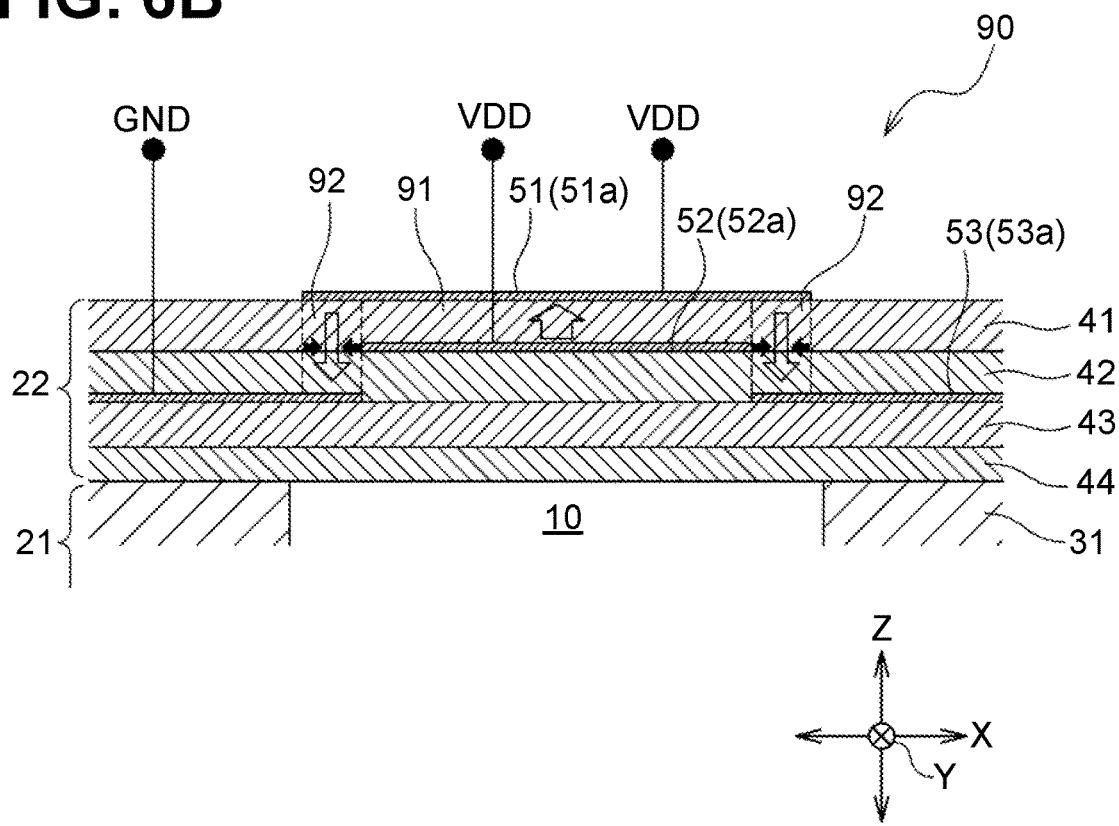

FIG. 7
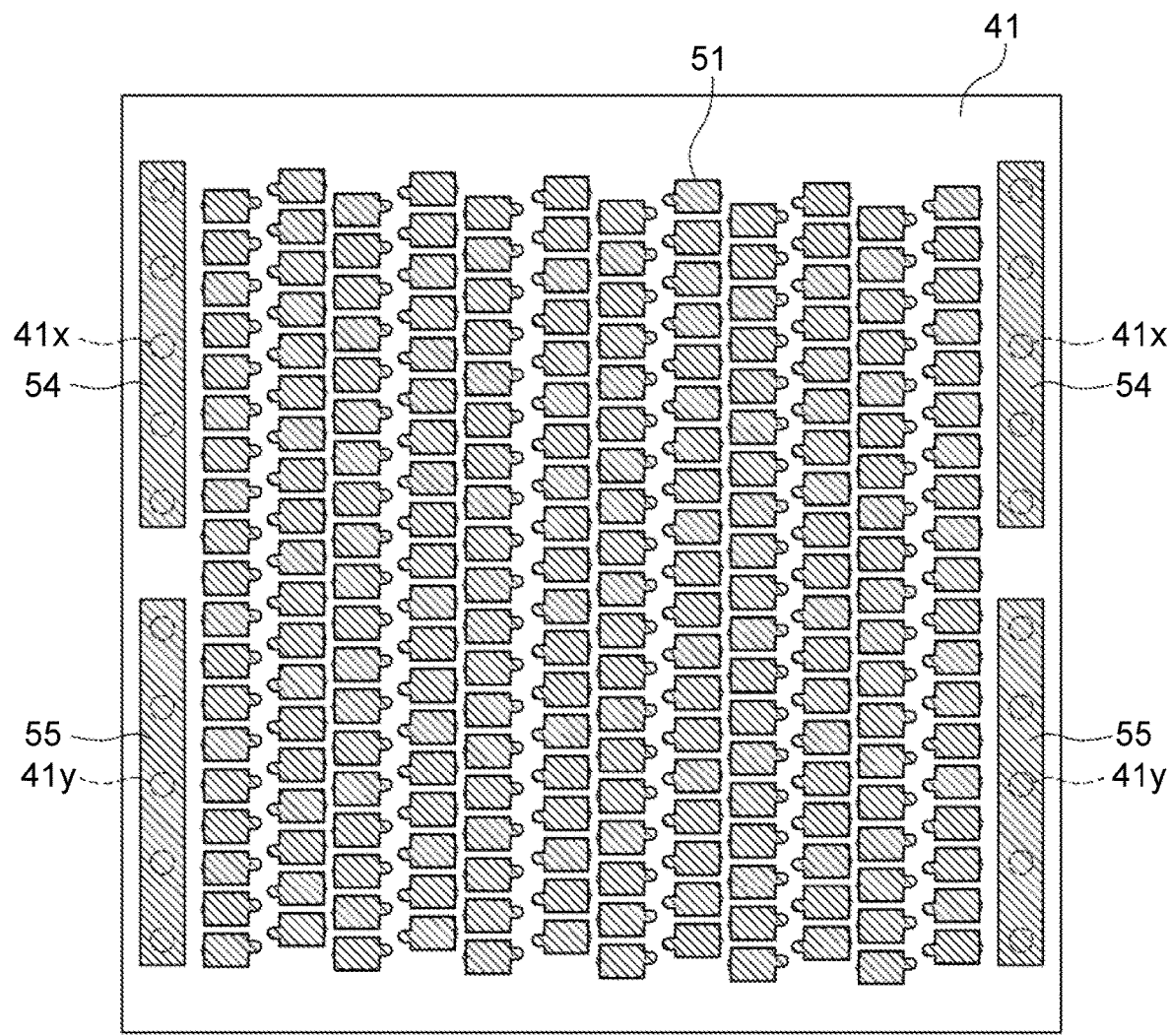
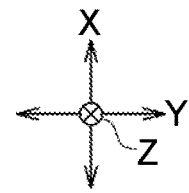

FIG. 9
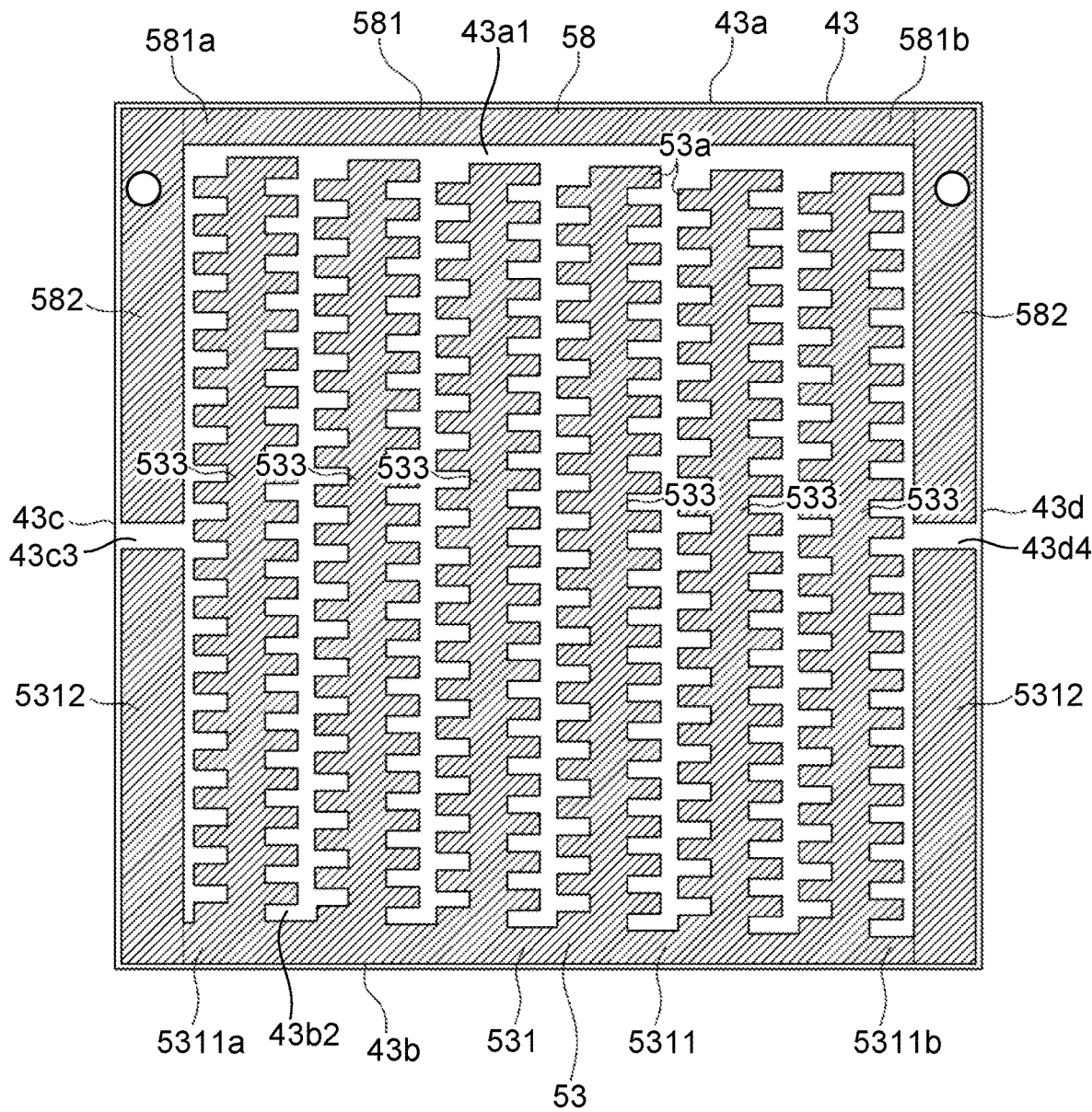
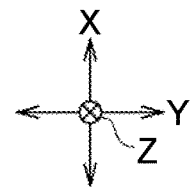

PIEZOELECTRIC ACTUATOR AND METHOD OF MANUFACTURING PIEZOELECTRIC ACTUATOR

CROSS-REFERENCE TO RELATED APPLICATION

This application claims priority from Japanese Patent Application No. 2020-059486 filed on Mar. 30, 2020, the content of which is incorporated herein by reference in its entirety.

TECHNICAL FIELD

Aspects of the disclosure relate to a piezoelectric actuator including a piezoelectric layer and an electrode layer, and a method of manufacturing the piezoelectric actuator.

BACKGROUND

A known piezoelectric actuator includes piezoelectric layers and electrode layers including, for example, a drive electrode, a high potential electrode, and a low potential electrode. Each of the electrode layers is disposed on one of surfaces of a corresponding one of the piezoelectric layers.

SUMMARY

For fixing the piezoelectric actuator to another member such as a channel member, through holes defined in the electrode layers may be detected and used as a reference for positioning the piezoelectric actuator relative to the channel unit. The electrode layers may be formed by screen printing using a squeegee. In screen printing, material used for forming the electrode layers may likely intrude into the through holes to cause blurring at upstream edges of the respective through holes in a moving direction of the squeegee. Such an intrusion of the material into the through holes may cause difficulty in detecting the through holes as positioning references. This may thus cause a problem that the piezoelectric actuator cannot be appropriately positioned relative to another member such as the channel unit.

Accordingly, aspects of the disclosure provide a piezoelectric actuator and a method of manufacturing the piezoelectric actuator that may increase accuracy of detecting a positioning reference.

In one or more aspects of the disclosure, a piezoelectric actuator may include a first piezoelectric layer and a first electrode layer. The first electrode layer may be disposed on a surface of the first piezoelectric layer. The first electrode layer may include a trunk portion and a plurality of brunch portions branched from the trunk portion. The trunk portion may include a plurality of junction points, an end, and a first through hole. Each branch portion of the plurality of branch portions may be branched from a corresponding junction point of the plurality of junction points. The end of the trunk portion may be spaced from the plurality of junction points. The first through hole may be positioned between the plurality of junction points and the end of the trunk portion. The first mark may be positioned inside the first through hole.

In one or more aspects of the disclosure, a method of manufacturing a piezoelectric actuator including a piezoelectric layer and an electrode layer may be provided. The method may include forming an electrode layer on a surface of a piezoelectric layer by screen printing in which a squeegee is moved in a moving direction along the surface of the piezoelectric layer. The electrode layer may include a trunk portion, a plurality of branch portions, an end, and a through hole. The plurality of branch portions may be branched from the trunk portion. Each branch portion of the plurality of branch portions may be branched from a corresponding junction point of the plurality of junction points. The end of the trunk portion may be spaced from the plurality of junction points. The through hole may be positioned between the plurality of junction points and the end of the trunk portion. The method may further include, subsequent to forming the electrode layer, forming a mark inside the through hole.

According to one or more aspects of the disclosure, the mark positioned inside the first through hole or the through hole but not the through hole whose outline edge may be likely blurred may be detected and used as a positioning reference, thereby improving a detection accuracy of the positioning reference.

BRIEF DESCRIPTION OF THE DRAWINGS

FIG. 3 is an enlarged view of a particular portion III of the head of FIG. 2 according to one or more illustrative embodiments of the disclosure.

FIG. 5 is a sectional view taken along line V-V of FIG. 3 according to one or more illustrative embodiments of the disclosure.

FIGS. 6A and 6B are sectional views of FIG. 5 each illustrating how an actuator portion behaves according to one or more illustrative embodiments of the disclosure.

FIG. 7 is a plan view of the piezoelectric actuator of FIG. 2 illustrating an upper surface of an uppermost piezoelectric layer among three piezoelectric layers included in the piezoelectric actuator according to one or more illustrative embodiments of the disclosure.

FIG. 9 is a plan view of the piezoelectric actuator of FIG. 2 illustrating an upper surface of a lowermost piezoelectric layer among the three piezoelectric layers included in the piezoelectric actuator according to one or more illustrative embodiments of the disclosure.

DETAILED DESCRIPTION

In the following description, a Z-axis direction corresponds to a vertical direction, and an X-axis direction and a Y-axis direction each correspond to a horizontal direction. The X-axis direction and the Y-axis direction are both orthogonal to the Z-axis direction. The X-axis direction is orthogonal to the Y-axis direction. The Z-axis direction corresponds to a third direction. The X-axis direction corresponds to a second direction. The Y-axis direction corresponds to a first direction.

Overall Configuration of Printer

Figure 1:
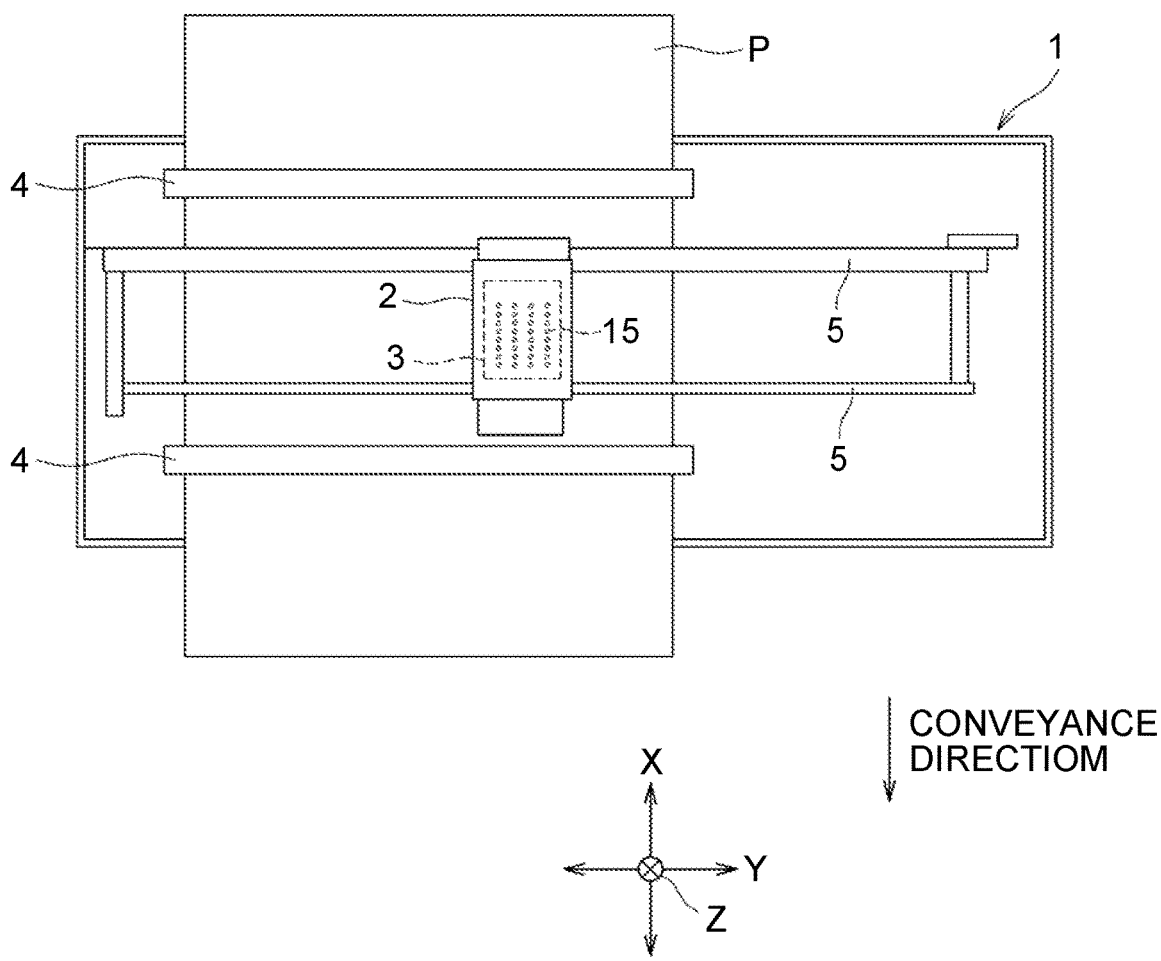
FIG. 1 illustrates an overall configuration of a printer including a piezoelectric actuator according to one or more illustrative embodiments of the disclosure.

Referring to FIG. 1, a description will be provided on an overall configuration of a printer 1 including a piezoelectric actuator according to one or more illustrative embodiments of the disclosure.

The printer 1 includes a head 3, a carriage 2, and two conveyance roller pairs 4.

The carriage 2 is supported by two guide rails 5 extending in the Y-axis direction. The carriage 2 is configured to reciprocate in the Y-axis direction along the guide rails 5.

The head 3 may be a serial head. The head 3 is mounted on the carriage 2 and is movable in the Y-axis direction together with the carriage 2. The head 3 has a plurality of nozzles 15 defined in its lower surface facing downward in the Z-axis direction.

The conveyance roller pairs 4 are disposed on opposite sides of the carriage 2 in the X-axis direction. In response to the conveyance roller pairs 4 rotating with at least one of the conveyance roller pairs 4 pinching a sheet P between its rollers, the sheet P is conveyed in a conveyance direction parallel to the X-axis direction.

The printer 1 includes a controller. The controller causes the printer 1 to alternately perform an ejecting operation and a conveying operation. In the ejecting operation, the controller causes the head 3 to eject ink from one or more of the nozzles 15 while moving the head 3 together with the carriage 2 in the Y-axis direction. In the conveying operation, the controller causes the conveyance roller pairs 4 to convey a sheet P by a certain distance in the conveyance direction. Such a control may thus enable recording of an image onto the sheet P.

Configuration of Head

Figure 2:
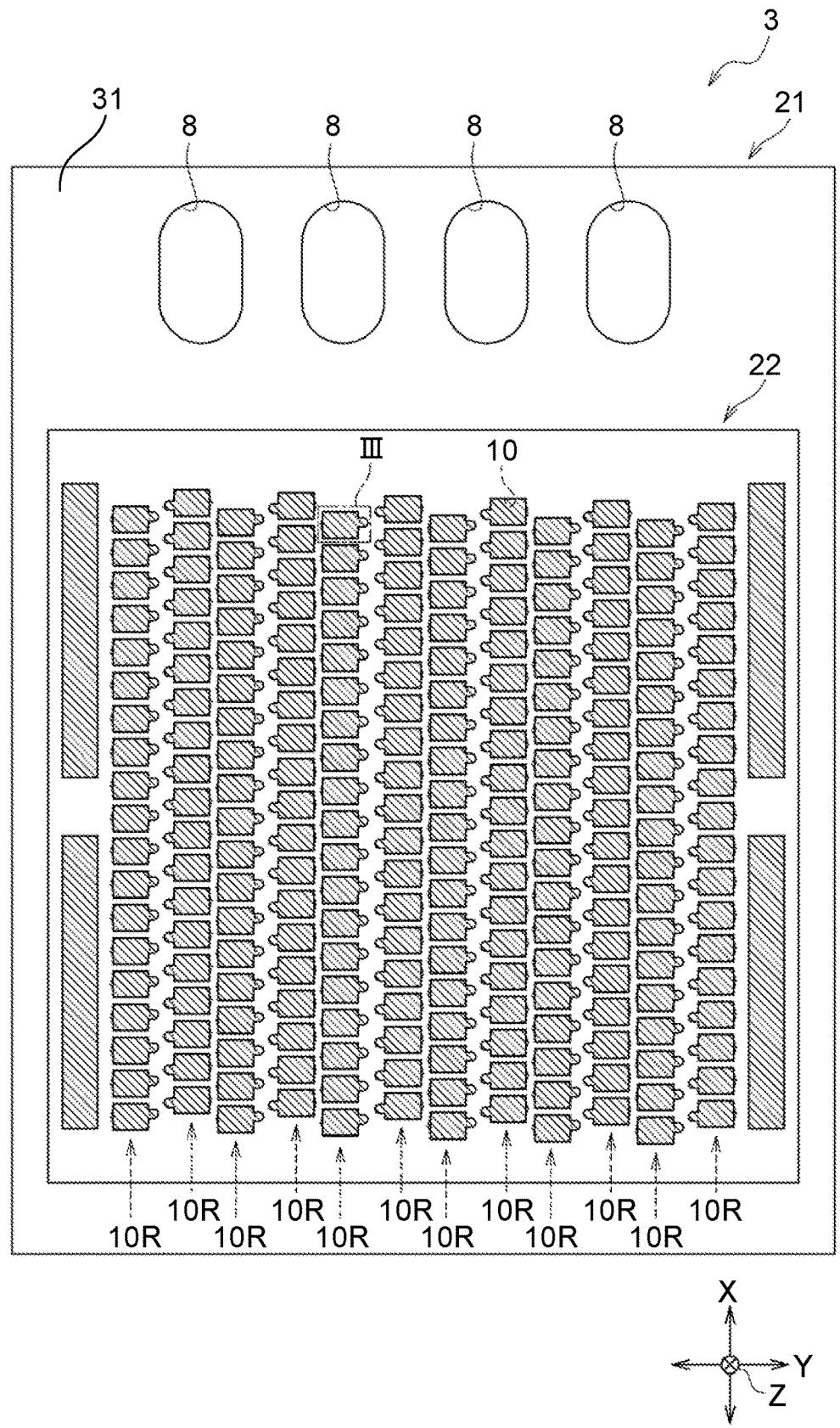
FIG. 2 is a plan view of a head of the printer of FIG. 1 including the piezoelectric actuator according to one or more illustrative embodiments of the disclosure.

As illustrated in FIG. 2, the head 3 includes a channel unit 21 and a piezoelectric actuator 22 according to a first illustrative embodiment.

Configuration of Channel Unit

Figure 4:
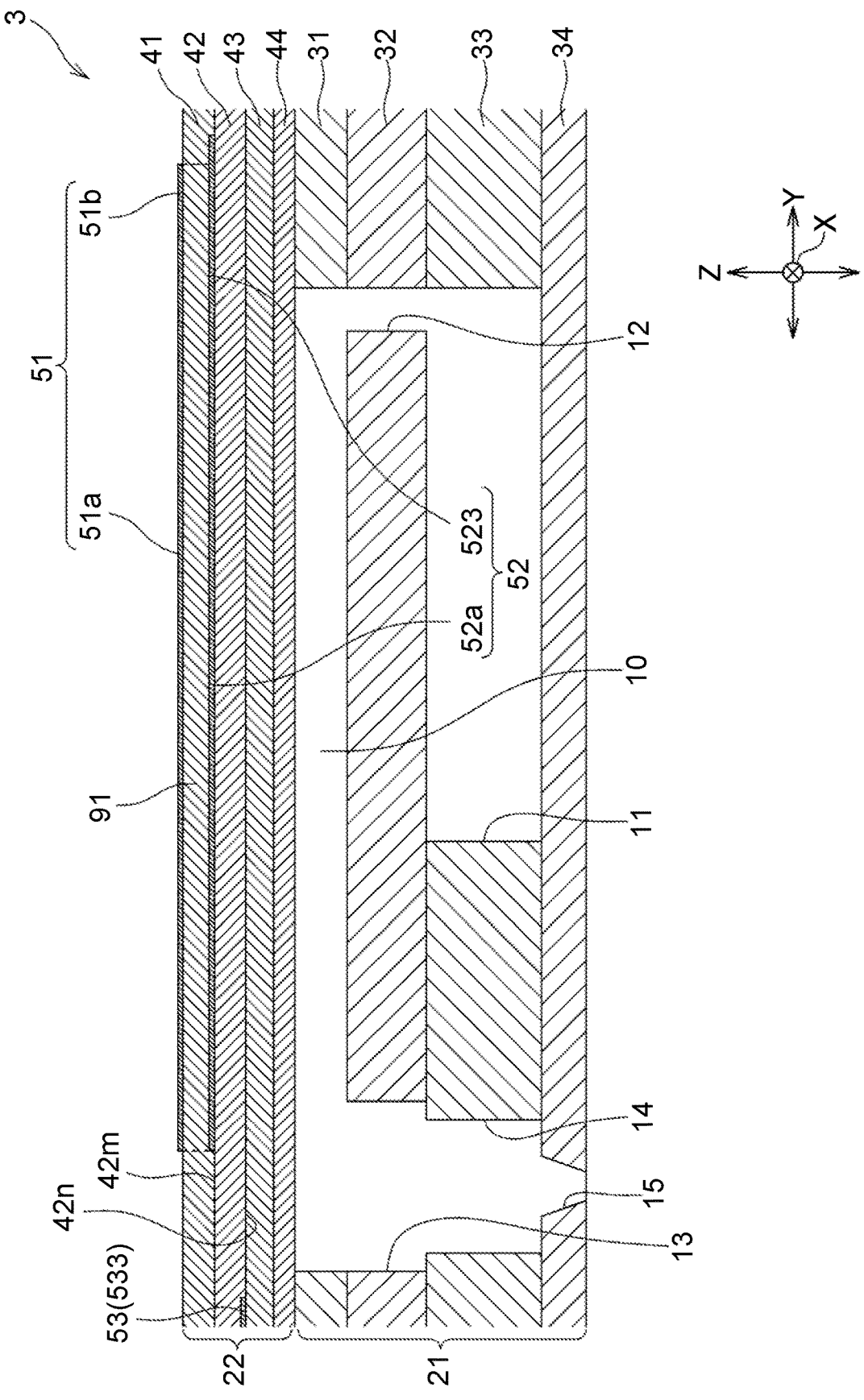
FIG. 4 is a sectional view taken along line IV-IV of FIG. 3 according to one or more illustrative embodiments of the disclosure.

As illustrated in FIG. 4, the channel unit 21 includes a plurality of plates, for example, four plates 31, 32, 33, and 34 stacked one above another in the Z-axis direction.

The plate 31 has a plurality of pressure chambers 10. The plate 32 has a plurality of communication channels 12 and a plurality of communication channels 13. One each of the communication channels 12 and 13 are provided for each pressure chamber 10. Each pressure chamber 10 has one end and another end in the Y-axis direction. Each communication channel 12 overlaps one end of a corresponding pressure chamber 10 in the Z-axis direction. Each communication channel 13 overlaps the other end of a corresponding pressure chamber 10 in the Z-axis direction. The plate 33 has communication channels 14 for the respective communication channels 13. Each communication channel 14 overlaps a corresponding communication channel 13 in the Z-axis direction. The plate 33 further has a plurality of manifold channels 11, for example, twelve manifold channels 11. The pressure chambers 10 are arranged in a plurality of rows 10R (refer to FIG. 2). In each row 10R, the pressure chambers 10 are aligned in the X-axis direction. The manifold channels 11 are provided for the respective rows 10R. Each manifold channel 11 extends in the X-axis direction and is in communication with the pressure chambers 10 belonging to a corresponding row 10R via the respective corresponding communication channels 12. The plate 34 has the nozzles 15 defined therein. Each nozzle 15 overlaps a corresponding communication channel 14 in the Z-axis direction.

The plate 31 further has a plurality of ink inlets 8, for example, four ink inlets 8, in an area where the piezoelectric actuator 22 is not disposed (refer to FIG. 2). Each ink inlet 8 is in communication with a corresponding ink cartridge and three corresponding manifold channels 11. Ink supplied from an ink cartridge to the head 3 via an ink inlet 8 flows into corresponding three manifold channels 11. Ink further flows from the manifold channels 11 via the communication channels 12 to the pressure chambers 10 belonging to the rows 10R corresponding to the three manifold channels 11. In response to the piezoelectric actuator 22 being driven, pressure is applied to ink in the pressure chambers 10. Thus, ink flows from the pressure chambers 10 to the respective nozzles 15 via the corresponding communication channels 13 and 14 and the head 3 ejects ink through the nozzles 15.

Configuration of Piezoelectric Actuator

As illustrated in FIG. 4, the piezoelectric actuator 22 is disposed on an upper surface of the channel unit 21. As illustrated in FIG. 4, the piezoelectric actuator 22 includes three piezoelectric layers 41, 42 and 43, an ink separation layer 44, a plurality of drive electrodes 51, a high potential electrode 52, and a low potential electrode 53. The piezoelectric layers 41, 42 and 43 and the ink separation layer 44 are stacked one above another in the Z-axis direction.

The ink separation layer 44 is disposed on an upper surface of the plate 31 and covers all the pressure chambers 10 defined in the plate 31. The ink separation layer 44 includes, for example, a metal material such as stainless steel, a piezoelectric material containing lead zirconate titanate as a main component, or a synthetic resin material.

The piezoelectric layer 43 is disposed on an upper surface of the ink separation layer 44. The piezoelectric layer 42 is disposed on an upper surface of the piezoelectric layer 43. The piezoelectric layer 41 is disposed on an upper surface of the piezoelectric layer 42. The piezoelectric layers 41, 42, and 43 each include, for example, a piezoelectric material containing lead zirconate titanate as a main component.

As illustrated in FIG. 3, the drive electrodes 51 are disposed on an upper surface of the piezoelectric layer 41 and each is in one-to-one correspondence with a corresponding pressure chamber 10. Each drive electrode 51 has a main portion 51a and a projecting portion 51b. The main portion 51a overlaps substantially the entirety of a corresponding pressure chamber 10 in the Z-axis direction. The projecting portion 51b protrudes from the main portion 51a in the Y-axis direction and does not overlap any pressure chamber 10 in the Z-axis direction. The projecting portion 51b has a contact electrically connected to wiring of a chip on film ("COF"). The COF includes a driver IC mounted thereon. The controller controls the driver IC to apply either a high potential (e.g., a VDD potential) or a low potential (e.g., a GND potential) to the respective drive electrodes 51 individually via the wiring of the COF.

As shown in FIG. 7, two high potential terminals 54, two low potential terminals 55 are disposed on the upper surface of the piezoelectric layer 41 in addition to the drive electrodes 51. The controller causes the driver IC to apply, via the wiring of the COF, a high potential (e.g., a VDD potential) to the high potential terminals 54 and a low potential (e.g., a GND potential) to the low potential terminals 55.

Figure 8:
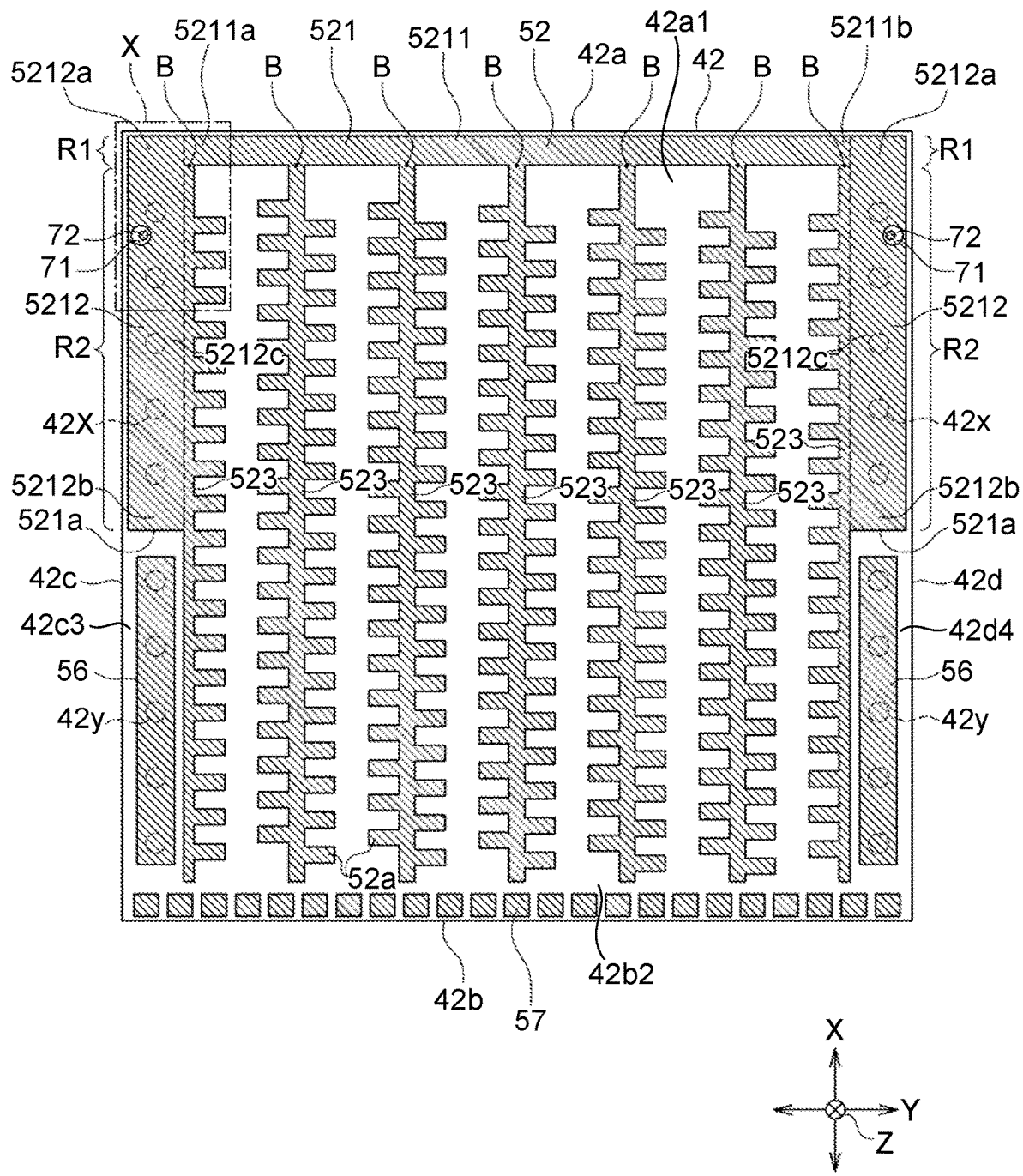
FIG. 8 is a plan view of the piezoelectric actuator of FIG. 2 illustrating an upper surface of a middle piezoelectric layer among the three piezoelectric layers included in the piezoelectric actuator according to a first illustrative embodiment of the disclosure.

As illustrated in FIG. 8, the high potential electrode 52 is disposed on the upper surface of the piezoelectric layer 42. The high potential electrode 52 includes a single trunk portion 521, a plurality of branch portions 523, and a plurality of individual portions 52a. The branch portions 523 are branched from the trunk portion 521. The individual portions 52a are arranged in the X-axis direction and connected to each other by the branch portions 523. Each individual portion 52a overlaps, in the Z-axis direction, a middle portion of a corresponding pressure chamber 10 in the X-axis direction (refer to FIG. 5).

The trunk portion 521 includes an elongated portion 5211 extending in the Y-axis direction and two elongated portions 5212 extending in the X-axis direction. Each elongated portion 5212 has one end portion 5212a, another end portion 5212b, and a midpoint 5212c in the X-axis direction. The one end portions 5212a of the elongated portions 5212 are connected to the elongated portion 5211. The X-axis direction and the Y-axis direction correspond directions along the upper surface of the piezoelectric layer 42. The X-axis direction intersects the Y-axis direction. In the first illustrative embodiment, the X direction is orthogonal to the Y-axis direction.

The piezoelectric layer 42 has a first end 42a and a second end 42b opposite to each other in the X-axis direction and a third end 42c and a fourth end 42d opposite to each other in the Y-axis direction. The piezoelectric layer 42 includes a first end portion 42a1 corresponding to the first end 42a, a second end portion 42b2 corresponding to the second end 42b, a third end portion 42c3 corresponding to the third end 42c, and a fourth end portion 42d4 corresponding to the fourth end 42d. The elongated portion 5211 extends in the Y-axis direction at the first end portion 42a1 of the piezoelectric layer 42. The elongated portion 5211 is provided with the branch portions 523. Each branch portion 523 extends along the X-axis direction from the elongated portion 5211 toward the second end 42b of the piezoelectric layer 42.

One of the elongated portions 5212 extends in the X-axis direction from the first end 42a of the piezoelectric layer 42 toward the middle between the first end 42a and the second end 42b at the third end portion 42c3 of the piezoelectric layer 42. The one elongated portion 5212 is connected to an end of one end 5211a of the elongated portion 5211 in the Y-axis direction and the branch portion 523 that is closest to the third end 42c of the piezoelectric layer 42 in the Y-axis direction among the plurality of branch portions 523.

The other of the elongated portions 5212 extends in the X-axis direction from the first end 42a of the piezoelectric layer 42 toward the middle between the first end 42a and the second end 42b at the fourth end portion 42d4 of the piezoelectric layer 42. The other elongated portion 5212 is connected to an end of the other end 5211b of the elongated portion 5211 in the Y-axis direction and the branch portion 523 that is closest to the fourth end 42d of the piezoelectric layer 42 in the Y-axis direction among the plurality of branch portions 523.

The piezoelectric layer 41 has through holes 41x (refer to FIG. 7). The elongated portions 5212 of the piezoelectric layer 42 are electrically connected to the respective corresponding high potential terminals 54 via the corresponding through holes 41x. Thus, the high potential electrode 52 including the elongated portions 5212 are electrically connected to the high potential terminals 54.

As shown in FIG. 8, two connection electrodes 56 and a plurality of electrodes 57 are disposed on the upper surface of the piezoelectric layer 42 in addition to the high potential electrode 52.

One of the connection electrodes 56 extends in the X-axis direction at the third end portion 42c3 of the piezoelectric layer 42. The one connection electrode 56 is aligned with the one elongated portion 5212 in the X-axis direction. The other of the connection electrodes 56 extends in the X-axis direction at the fourth end portion 42d4 of the piezoelectric layer 42. The other connection electrode 56 is aligned with the other elongated portion 5212 in the X-axis direction. The piezoelectric layer 41 has through holes 41y (refer to FIG. 7). The connection electrodes 56 are electrically connected to the respective corresponding low potential terminals 55 via the corresponding through holes 41y.

The electrodes 57 are aligned in the Y-axis direction at the second end portion 42b2 of the piezoelectric layer 42. The electrodes 57 are not electrically connected to the high potential terminals 54 or the low potential terminals 55. The driver IC is thus not allowed to apply charge to the electrodes 57.

As illustrated in FIG. 9, the low potential electrode 53 is disposed on the upper surface of the piezoelectric layer 43. The low potential electrode 53 includes a single trunk portion 531, a plurality of branch portions 533, and a plurality of individual portions 53a. The branch portions 533 are branched from the trunk portion 531. The individual portions 53a are arranged in the X-axis direction and connected to each other by the branch portions 533. Among the individual portions 53a arranged in the X-axis direction, except for the endmost individual portions 53a in the X-axis direction, each individual portion 53a extends over adjacent two of the pressure chambers 10 in the X-axis direction. In each individual portion 53a, its end portions in the X-axis direction overlap the adjacent two pressure chambers 10 in the Z-axis direction (refer to FIG. 5). Each of the endmost individual portions 53a in the X-axis direction overlaps a corresponding one of the pressure chambers 10 in the Z-axis direction. That is, an individual portion 53a occupies an area in which the individual portion 53a overlaps, in the Z-axis direction, one end of a corresponding pressure chamber 10 and the other end of another corresponding pressure chamber 10 of adjacent two pressure chambers 10 in the X-axis direction and a portion of the upper surface of the piezoelectric layer 42 between the adjacent two pressure chambers 10 in the X-axis direction.

The trunk portion 531 includes an elongated portion 5311 extending in the Y-axis direction and two elongated portions 5312 extending in the X-axis direction.

The piezoelectric layer 43 has a fifth end 43a and a sixth end 43b opposite to each other in the X-axis direction and a seventh end 43c and an eighth end 43d opposite to each other in the Y-axis direction. The piezoelectric layer 43 includes a fifth end portion 43a1 corresponding to the fifth end 43a, a sixth end portion 43b2 corresponding to the sixth end 43b, a seventh end portion 43c3 corresponding to the seventh end 43c, and an eighth end portion 43d4 corresponding to the eighth end 43d. The elongated portion 5311 extends in the Y-axis direction at the sixth end portion 43b2 of the piezoelectric layer 43. The elongated portion 5311 is provided with the branch portions 533. Each branch portion 533 extends along the X-axis direction from the elongated portion 5311 toward the fifth end 43a of the piezoelectric layer 43.

One of the elongated portions 5312 extends in the X-axis direction from the sixth end 43b of the piezoelectric layer 43 toward the middle between the fifth end 43a and the sixth end 43b at the seventh end portion 43c3 of the piezoelectric layer 43. The one elongated portion 5312 is connected to an end of one end portion 5311a of the elongated portion 5311 in the Y-axis direction.

The other of the elongated portions 5312 extends in the X-axis direction from the sixth end 43b of the piezoelectric layer 43 toward the middle between the fifth end 43a and the sixth end 43b at the eighth end portion 43d4 of the piezoelectric layer 43. The other elongated portion 5312 is connected to an end of the other end portion 5311b of the elongated portion 5311 in the Y-axis direction.

The piezoelectric layer 42 has through holes 42y (refer to FIG. 8). The elongated portions 5312 of the piezoelectric layer 42 are electrically connected to the respective corresponding correction electrodes 56 via the corresponding through holes 42y. The connection electrodes 56 are electrically connected to the respective corresponding low potential terminals 55 via the corresponding through holes 41y (refer to FIG. 7) of the piezoelectric layer 41. Thus, the low potential electrode 53 including the elongated portions 5312 are electrically connected to the low potential terminals 55.

As shown in FIG. 9, a connection electrode 58 is disposed on the upper surface of the piezoelectric layer 43 in addition to the low potential electrode 53.

The connection electrode 58 includes an elongated portion 581 and two elongated portions 582. The elongated portion 581 extends in the Y-axis direction at the fifth end portion 43a1 of the piezoelectric layer 43. The elongated portion 581 has one end portion 581a and another end portion 581b in the Y-axis direction. The elongated portions 582 extend in the X-axis direction. The elongated portions 582 are connected to an end of the one end portion 581a and an end of the other end portion 581b, respectively, of the elongated portion 581.

The piezoelectric layer 42 has through holes 42x (refer to FIG. 8). The elongated portions 582 of the piezoelectric layer 42 are electrically connected to the respective corresponding elongated portions 5212 of the high potential electrode 52 via the corresponding through holes 42x. The elongated portions 5212 are electrically connected to the respective corresponding high potential terminals 54 via the corresponding through holes 41x (refer to FIG. 7) of the piezoelectric layer 41. Thus, the connection electrode 58 including the elongated portions 582 is electrically connected to the high potential terminals 54.

As described above, the connection electrode 58 electrically connected to the high potential electrode 52 is disposed below the high potential electrode 52. Such a configuration may thus increase the number of routes for distributing, to the high potential electrode 52, charge applied to the high potential terminals 54 by the driver IC, thereby improving electrical reliability.

Actuator Portions

As illustrated in FIG. 5, the piezoelectric actuator 22 includes an actuator portion 90 for each pressure chamber 10. Each actuator portion 90 includes a single first active portion 91 and two second active portions 92. In each actuator portion 90, a first active portion 91 is disposed between second active portions 92 in the X-axis direction. A first active portion 91 corresponds to a portion of the piezoelectric layer 41 sandwiched between a drive electrode 51 and an individual portion 52a of the high potential electrode 52 in the Z-axis direction. A second active portion 92 corresponds to a particular overlapping portion of the piezoelectric layers 42 and 43 sandwiched between a drive electrode 51 and an individual portion 53a of the low potential electrode 53 in the Z-axis direction. A first active portion 91 is polarized mainly upward. A second active portion 92 is polarized mainly downward.

Hereinafter, referring to FIGS. 6A and 6B, a description will be provided on how an actuator portion 90 behaves when ink is ejected from the head 3 through a corresponding nozzle 15.

Before the printer 1 starts a recording operation, as illustrated in FIG. 6A, a low potential (e.g., the GND potential) is applied to each drive electrode 51. At that time, in the actuator portion 90, an electric field directed in an upward direction is generated in the first active portion 91 due to a potential difference between the drive electrode 51 and the high potential electrode 52. The upward direction in which the electric field is directed may be the same direction as a polarization direction of the first active portion 91. The first active portion 91 thus contracts in a surface direction (e.g., a direction along the X-axis direction and the Y-axis direction) of the piezoelectric layer 41. Accordingly, a portion of a lamination of the piezoelectric layers 41 to 43 and the ink separation layer 44 overlapping a pressure chamber 10 in the Z-axis direction is bent so as to be convex toward the pressure chamber 10 (e.g., downward). At that time, the pressure chamber 10 has a smaller volume than that when the lamination is in a flat state.

For ejecting ink from the head 3 through a particular nozzle 15 in response to the printer 1 starting a recording operation, first, potential for a drive electrode 51 corresponding to the nozzle 15 is changed from a low potential (e.g., the GND potential) to a high potential (e.g., a VDD potential). In response to this, the potential difference between the drive electrode 51 and the high potential electrode 52 disappears, and thus, as shown in FIG. 6B, the contraction of the first active portion 91 is eliminated. At that time, an electric field directed in a downward direction is generated in the second active portion 92 due to a potential difference between the drive electrode 51 and the low potential electrode 53. The downward direction in which the electric field is directed may be the same as a polarization direction of the second active portion 92. The second active portions 92 thus contract in a surface direction (e.g., a direction along the X-axis direction and the Y-axis direction) of the piezoelectric layer 41. Nevertheless, the second active portions 92 each reduce or prevent crosstalk (i.e., a phenomenon in which pressure fluctuation caused by deformation of the actuator portion 90 in a particular pressure chamber 10 is transmitted to another pressure chamber 10 adjacent to the particular pressure chamber 10 in the X-axis direction), and thus the contraction of the second active portions 92 is not likely to contribute to deformation of the actuator portion 90. That is, at this time, the lamination is in a flat state. In other words, the lamination might not be bent such that the portion overlapping the pressure chamber 10 in the Z-axis direction protrudes in a direction away from the pressure chamber 10 (e.g., upward). Thus, the pressure chamber 10 has a larger volume than the volume of the pressure chamber 10 in a state of FIG. 6A.

Thereafter, the potential for the drive electrode 51 corresponding to the nozzle 15 is changed from the high potential (e.g., the VDD potential) to the low potential (e.g., the GND potential). In response to this, the potential difference between the drive electrode 51 and the low potential electrode 53 disappears, and thus, as shown in FIG. 6A, the contraction of the second active portions 92 is eliminated. At that time, an electric field directed in the upward direction is generated in the first active portion 91 due to a potential difference between the drive electrode 51 and the high potential electrode 52. The upward direction in which the electric field is directed may be the same as the polarization direction of the first active portion 91. The first active portion 91 thus contracts in the surface direction of the piezoelectric layer 41. Accordingly, a portion the lamination overlapping the pressure chamber 10 in the Z-axis direction is bent so as to be convex toward the pressure chamber 10 (e.g., downward). At that time, the volume of the pressure chamber 10 is extremely reduced and thus a high pressure acts on ink in the pressure chamber 10, thereby causing ink ejection from the head 3 through the nozzle 15 that is in fluid communication with the pressure chamber 10.

The piezoelectric layer 42 corresponds to a first piezoelectric layer. The high potential electrode 52 disposed on the upper surface (e.g., a surface) of the piezoelectric layer 42 corresponds to a first electrode layer. The elongated portion 5211 corresponds to a first elongated portion. The one elongated portion 5212 corresponds to a second elongated portion. The other elongated portion 5212 corresponds to a third elongated portion. The piezoelectric layer 41 disposed on the upper surface (e.g., the surface) of the piezoelectric layer 42 via the high potential electrode 52 corresponds to a second piezoelectric layer. The piezoelectric layer 43 disposed opposite to the piezoelectric layer 41 with respect to the piezoelectric layer 42 in the Z-axis direction corresponds to a third piezoelectric layer. Each drive electrode 51 disposed on the upper surface (e.g., the surface) of the piezoelectric layer 41 and opposite to the high potential electrode 52 with respect to the piezoelectric layer 42 corresponds to a second electrode layer. The low potential electrode 53 disposed between the piezoelectric layer 42 and the piezoelectric layer 43 in the Z-axis direction corresponds to a third electrode layer.

In the high potential electrode 52, as shown in FIG. 8, the trunk portion 521 further includes a plurality of junction points B from which the respective branch portions 523 are branched, and ends 521a spaced from the junction points B. The junction points B are included in the elongated portion 5211. The ends 521a are included in the other end portions 5212b of the elongated portions 5212, respectively.

The trunk portion 521 has a through hole 71 at each elongated portion 5212. In each elongated portion 5212, the through hole 71 is positioned between the plurality of junction points B and each of the ends 521a. A mark 72 is positioned inside each through hole 71. Each mark 72 includes the same material as the high potential electrode 52 and other electrodes such as the drive electrodes 51 and the low potential electrode 53. Examples of the material include, for example, silver, nickel, and gold.

In each elongated portion 5212, the through hole 71 and the mark 72 are positioned between the end portion 5212a and the midpoint 5212c in the X-axis direction.

Each elongated portion 5212 has a first region R1 and a second region R2. The first region R1 overlaps the elongated portion 5211 in the Y-axis direction. The second region R2 might not overlap the elongated portion 5211 in the Y-axis direction. The through hole 71 and the mark 72 are positioned in the second region R2 of each elongated portion 5212.

Figure 10:
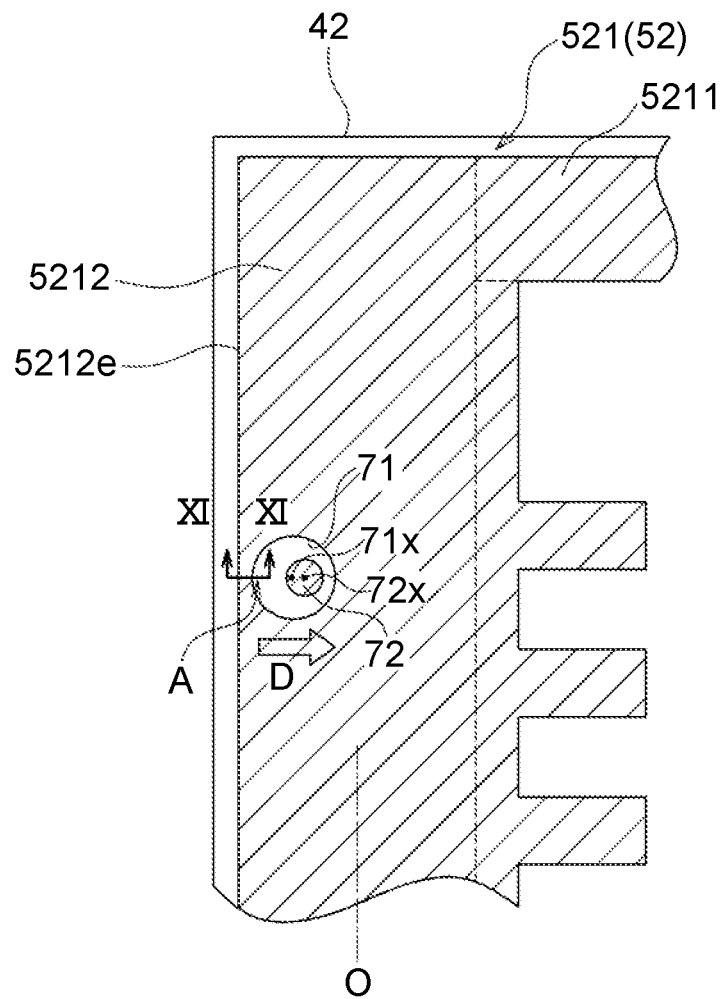
FIG. 10 is an enlarged view of a particular portion X of the piezoelectric actuator of FIG. 8 according to the first illustrative embodiment of the disclosure.

In the one elongated portion 5212, the through hole 71 and the mark 72 are offset toward an end of the elongated portion 5212 that is opposite to the end that is connected to the branch portion 523 that is closest to the third end 42c of the piezoelectric layer 42 in the Y-axis direction among the plurality of branch portions 523. That is, the through hole 71 and the mark 72 are offset toward the left in FIG. 8. In the other elongated portion 5212, the through hole 71 and the mark 72 are offset toward an end of the elongated portion 5212 that is opposite to the end that is connected to the branch portion 523 that is closest to the fourth end 42d of the piezoelectric layer 42 in the Y-axis direction among the plurality of branch portions 523. That is, the through hole 71 and the mark 72 are offset toward the right in FIG. 8. Although only the one elongated portion 5212 is illustrated in FIG. 10, the other elongated portion 5212 is symmetrically identical with the one elongated portion 5212. As illustrated in FIG. 10, in the one elongated portion 5212, the through hole 71 and the mark 72 are located such that the center 71x of the through hole 71 and the center 72x of the mark 72 are positioned between a center line O and an end 5212e of the one elongated portion 5212 in the Y-axis direction. The end 5212e of the one elongated portion 5212 is spaced from the elongated portion 5211 in the Y-axis direction. The center line O passes the center of the one elongated portion 5212 and extends in the Y-axis direction. In the other elongated portion 5212, the mark 72 is located such that the center 72x of the through hole 71 and the mark 72 are located between a center line O and the end 5212e of the other elongated portion 5212 in the Y-axis direction. The center line O passes the center of the other elongated portion 5212 and extends in the Y-axis direction.

The through hole 71 and the mark 72 both have a circular shape when viewed in the Z-axis direction. Nevertheless, the center 72x of the mark 72 is offset from the center 71x of the through hole 71. More specifically, for example, in each elongated portion 5212, the center 72x of the mark 72 is positioned downstream from the center 71x of the through hole 71 in a moving direction D of a squeegee 100. The moving direction D is parallel to the Y-axis direction, and may be, for example, a direction from left to right in FIG. 8.

Hereinafter, a description will be provided on a method of manufacturing the piezoelectric actuator 22.

The piezoelectric actuator 22 according to the first illustrative embodiment is manufactured by forming the piezoelectric layers 41, 42, and 43 and electrodes such as the drive electrodes 51, the high potential electrode 52, and the low potential electrode 53 one after another on the upper surface of the ink separation layer 44 (refer to FIG. 5). Each electrode is formed on an appropriate piezoelectric layer by screen printing. More specifically, for example, a screen mask 101 is placed on an upper surface of an appropriate piezoelectric layer. Then, material is applied to the screen mask 101 using the squeegee 100 (refer to FIG. 11) to form the electrode on the upper surface of the piezoelectric layer. Although a description is provided on how to screen print of the one elongated portion 5212 of the high potential electrode 52, the same is applied to screen printing of the other elongated portion 5212 of the high potential electrode 52.

Figure 11:
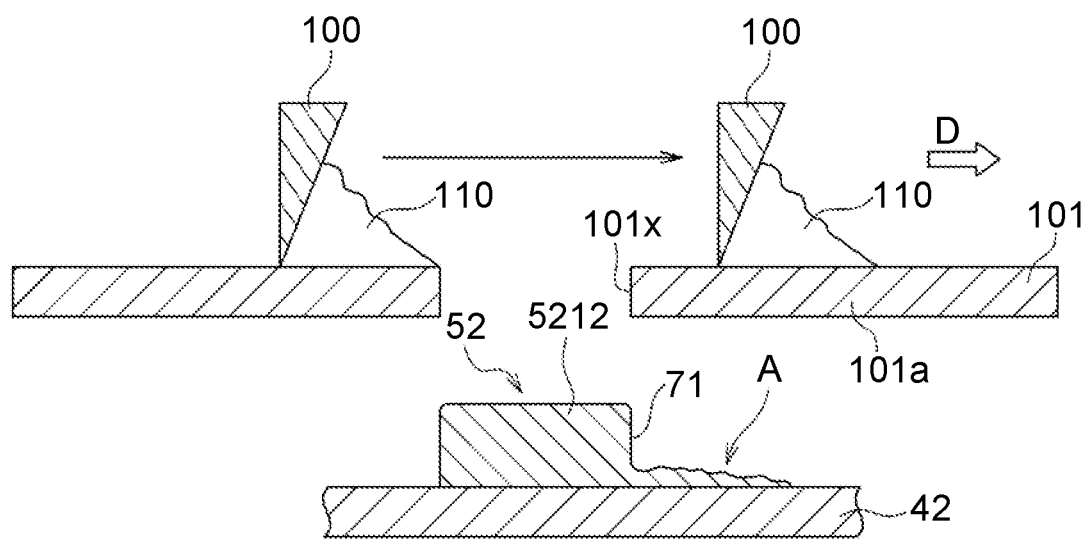
FIG. 11 is a sectional view taken along line XI-XI of FIG. 10 illustrating an electrode layer forming step in which a high electrode layer is formed by screen printing according to one or more illustrative embodiments of the disclosure.

In a step of forming the high potential electrode 52 (e.g., an electrode layer forming step), as illustrated in FIG. 11, the screen mask 101 including a portion 101a corresponding to the through hole 71 is placed on the upper surface of the piezoelectric layer 42, and the squeegee 100 is moved along the moving direction D to form the high potential electrode 52 on the piezoelectric layer 42 by screen printing. More specifically, for example, the squeegee 100 is moved while a downstream surface of the squeegee 100 holds material 110 for electrodes in the moving direction D. Examples of the material 110 include silver, nickel, and gold. Some of the material 110 enters an aperture 101x of the screen mask 101 and thus the high potential electrode 52 is formed on the piezoelectric layer 42. Nevertheless, at this time, the material 110 may likely intrude into the through hole 71 to cause blurring at a portion A adjacent to an upstream edge of the through hole 71 in the moving direction D in the high potential electrode 52.

Thus, after forming the high potential electrode 52 having the through hole 71 is formed as described above, the mark 72 is formed inside the through hole 71 (e.g., a mark forming step). In the mark forming step, the same material 110 as the material used for the high potential electrode 52 is used. The mark 72 is formed so that the center 72x of the mark 72 is positioned downstream from the center 71x of the through hole 71 in the moving direction D (refer to FIG. 10). The mark 72 is also formed by screen printing in the same manner as the manner adopted in the formation of the high potential electrode 52.

In the piezoelectric actuator 22 according to the first illustrative embodiment, the high potential electrode 52 includes the trunk portion 521, and the branch portions 523 branched from the trunk portion 521. The trunk portion 521 includes the junction points B from which the respective branch portions 523 are branched, and the ends 521a spaced from the junction points B. The trunk portion 521 has the through hole 71 between the plurality of junction points B and each of the ends 521a. Each mark 72 is positioned inside a corresponding through hole 71.

In the method of manufacturing the piezoelectric actuator 22 according to the first illustrative embodiment, the high potential electrode 52 having the through holes 71 is formed by screen printing in which the squeegee 100 is moved in the moving direction D. Thereafter, each mark 72 is formed inside a corresponding through hole 71.

According to the first illustrative embodiment, the marks 72 positioned inside the respective through holes 71 are detected as positioning references, instead of the through holes 71 whose outline edged are likely to be blurred (refer to FIG. 11), thereby improving a detection accuracy of the positioning references.

Forming the marks 72 inside the respective through holes 71 may enable the piezoelectric actuator 22 to have a shorter dimension in the Y-axis direction as compared with a piezoelectric actuator having the marks 72 outside the through holes 71 at respective portions adjacent to the high potential electrode 52 (e.g., at a portion further to the third end 42c or the fourth end 42d than the high potential electrode 52 in the Y-axis direction).

In the piezoelectric actuator 22 according to the first illustrative embodiment, in each elongated portion 5212 (only the one elongated portion 5212 is illustrated in FIG. 10), the center 72x of the mark 72 is offset from the center 71x of the through hole 71. In other word, the mark 72 is positioned where the material 110 that may spread and intrude into the through hole 71 does not reach the mark 72. If the center 72x of the mark 72 and the center 71x of the through hole 71 coincide with each other, a gap between the outline edge of the through hole 71 and the outline edge of the mark 72 is not enough and thus the mark 72 may contact the material 110 that may spread and intrude into the through hole 71. This may cause difficulty in detecting the mark 72 in positioning of the piezoelectric actuator 22 relative to the channel unit 21. In order to reduce or prevent such a problem, the size of the through hole 71 may be increased to secure the gap between the outline edge of the through hole 71 and the outline edge of the mark 72. If, nevertheless, the through hole 71 has a larger diameter than a diameter of the through hole 71 of the first illustrative embodiment, electric resistance in the high potential electrode 52 may be increased, and eventually, deformation of the actuator portions 90 may be prevented due to insufficient supply of electric charge from the trunk portion 521 to the branch portions 523. In the piezoelectric actuator 22 according to the first illustrative embodiment, the mark 72 is located inside the through hole 71 such that the center 72x of the mark 72 is offset from the center 71x of the through hole 71. This arrangement may reduce or prevent the mark 72 from connecting to the material 110 that spreads and intrudes into the through hole 71. Thus, an appropriate gap may be secured between the outline edge of the through hole 71 and the outline edge of the mark 72 without increasing the diameter of the through hole 71. This configuration may thus reduce or prevent upsizing of the through holes 71, thereby reducing or preventing increase of electric resistance in the high potential electrode 52.

In the method of manufacturing the piezoelectric actuator 22 according to the first illustrative embodiment, each mark 72 is formed so that the center 72x of the mark 72 is positioned downstream from the center 71x of a corresponding through hole 71 in the moving direction D (refer to FIG. 10). Thus, the marks 72 may be formed at the respective positions more reliably while avoiding the portion A where blurring may likely occur. Consequently, such a manufacturing method may more reliably reduce difficulty in detection of the marks 72 that may be hardly identified due to intrusion of the material 110 into the through holes 71.

As illustrated in FIG. 8, the mark 72 is positioned at each of the elongated portions 5212 that are spaced from each other in the Y-axis direction. With this configuration, both marks 72 are detected and used as the positioning references, thereby accurately positioning the piezoelectric actuator 22 relative to the channel unit 21 with reference to the detected marks 72.

As illustrated in FIG. 10, in each elongated portion 5212, the through hole 71 and the mark 72 are located such that the center 71x of the through hole 71 and the center 72x of the mark 72 are positioned between the center line O and the end 5212e of the elongated portion 5212 in the Y-axis direction. Although only the one elongated portion 5212 is illustrated in FIG. 10, the other elongated portion 5212 is symmetrically identical with the one elongated portion 5212. Such a configuration may enable the distance between the marks 72 in the Y-axis direction to be increased (refer to FIG. 8), thereby accurately positioning the piezoelectric actuator 22 relative to the channel unit 21 with reference to the detected marks 72.

In each elongated portion 5212, the mark 72 is positioned between the end portion 5212a and the midpoint 5212c in the X-axis direction (refer to FIG. 8). The trunk portion 521 has an angular C shape. The marks 72 are positioned adjacent to respective corners of the trunk portion 521. With this configuration, the marks 72 are detected and used as the positioning references, thereby accurately positioning the piezoelectric actuator 22 relative to the channel unit 21 with reference to the detected marks 72.

As illustrated in FIG. 8, each elongated portion 5212 has the mark 72 in the second region R2. The first region R1 of the elongated portion 5212 corresponds to one of the corner portions of the trunk portion 521 that is likely to be warped. If the marks 72 are positioned in the respective first regions R1 and the detected marks 72 are used as the positioning references, the piezoelectric actuator 22 might not be accurately positioned relative to the channel unit 21 due to warping occurring in one or both of the first regions R1. According to the first illustrative embodiment, the marks 72 are positioned in the respective second regions R2 but not in the first regions R1. Such a configuration may thus reduce occurrence of such a problem.

In each actuator portion 90 of the piezoelectric actuator 22 according to the first illustrative embodiment, the position of the first active portion 91 is determined based on the position of the high potential electrode 52. The positions of the first active portion 91 significantly affects deformation characteristics of the actuator portions 90. Thus, the positioning of the high potential electrode 52 is of importance. According to the first illustrative embodiment, the high potential electrode 52 may be accurately positioned relative to the channel unit 21 with reference to the marks 72. Thus, the positions of the first active portions 91 may be accurately determined, thereby achieving the desired deformation characteristics of the actuator portions 90.

The marks 72 include the same material as the high potential electrode 52. Using the same material as the high potential electrode 52 may facilitate the manufacturing of the piezoelectric actuator 22.

Second Illustrative Embodiment

Figure 12:
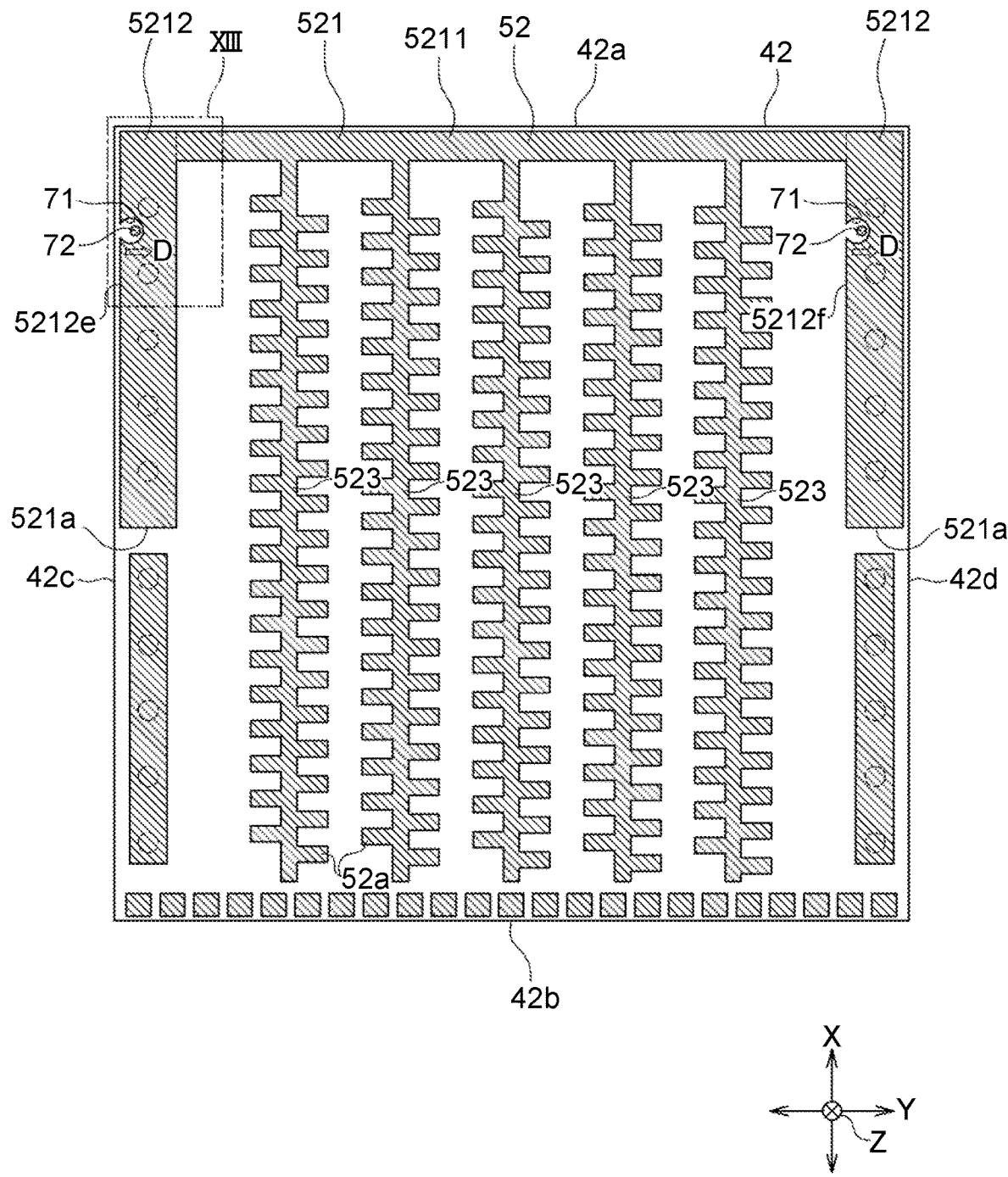
FIG. 12 is a plan view of a piezoelectric actuator of FIG. 2 illustrating an upper surface of a middle piezoelectric actuator among three piezoelectric layers included in the piezoelectric actuator according to a second illustrative embodiment.

Referring to FIG. 12, a description will be provided on a piezoelectric actuator according to a second illustrative embodiment. A description will be given mainly for the components different from the first illustrative embodiment, and a description will be omitted for the common components by assigning the same reference numerals thereto.

In the first illustrative embodiment, as illustrated in FIG. 8, in each elongated portion 5212, the through hole 71 and the mark 72 are offset toward the end of the elongated portion 5212 that is opposite to the end that is connected to the branch portion 523 that is closest to the third end 42c or the fourth end 42d of the piezoelectric layer 42 in the Y-axis direction among the plurality of branch portions 523. That is, the through hole 71 and the mark 72 are offset toward the left or the right in FIG. 8. In the second illustrative embodiment, as illustrated in FIG. 12, in each elongated portion 5212, the through hole 71 and the mark 72 are offset toward the same side (e.g., toward the left in FIG. 8) in the Y-axis direction.

In the first illustrative embodiment, as illustrated in FIG. 8, each through hole 71 is defined by the high potential electrode 52 and has a complete circular shape when viewed in the Z-axis direction. That is, each through hole 71 has a closed edge. In the second illustrative embodiment, as illustrated in FIG. 12, each through hole 71 has a circular shape having a gap, that is, a C shape when viewed in the Z-axis direction. That is, each through hole 71 is defined by an edge having a gap that opens to a corresponding particular end of the high potential electrode 52.

More specifically, for example, in the one elongated portion 5212 (e.g., the left elongated portion 5212 in FIG. 12), the gap in the edge of the through hole 71 opens to the end 5212e. The end 5212e is spaced from the elongated portion 5211 in the Y-axis direction and is farther from the elongated portion 5211 than an end opposite to the end 5212e in the Y-axis direction. In the other elongated portion 5212 (e.g., the right elongated portion 5212 in FIG. 12), the gap in the edge of the through hole 71 opens to an end 5212f. The end 5212f is in contact with the elongated portion 5211 and is closer to the elongated portion 5211 than an end opposite to the end 5212f in the Y-axis direction.

In the second illustrative embodiment, the blanch portions 523 that are connected to the respective elongated portions 5212 (i.e., the branch portion 523 that is closest to the third end 42c of the piezoelectric layer 42 in the Y-axis direction and the branch portion 523 that is closest to the fourth end 42d of the piezoelectric layer 42 in the Y-axis direction among the plurality of branch portions 523 in the first illustrative embodiment) are omitted.

In the second illustrative embodiment, in forming of the high potential electrode 52 (e.g., an electrode layer forming step), the high potential electrode 52 is formed by screen printing in which the squeegee 100 (refer to FIG. 11) is moved along the moving direction D in the same manner as the first illustrative embodiment. In the one elongated portion 5212, the gap in the edge of the through hole 71 opens to the end 5212e that is the upstream end of the one elongated portion 5212 in the moving direction D. In the other elongated portion 5212, the gap in the edge of the through hole 71 opens to the end 5212f of that is the upstream end the other elongated portion 5212 in the moving direction D.

As described above, in the second illustrative embodiment, the gap in the edge of each through hole 71 opens to a corresponding particular end of the high potential electrode 52. This configuration may thus reduce or prevent upsizing of the through holes 71, thereby reducing or preventing increase of electric resistance in the high potential electrode 52.

In the one elongated portion 5212 (e.g., the left elongated portion 5212 in FIG. 12), the gap in the edge of the through hole 71 opens to the end 5212f. The end 5212e is spaced from the elongated portion 5211 in the Y-axis direction and is farther from the elongated portion 5211 than the end opposite to the end 5212e in the Y-axis direction. In the other elongated portion 5212 (e.g., the right elongated portion 5212 in FIG. 12), the gap in the edge of the through hole 71 opens to the end 5212f. The end 5212f is in contact with the elongated portion 5211 and is closer to the elongated portion 5211 than the end opposite to the end 5212f in the Y-axis direction. Thus, the moving direction D of the squeegee 100 is defined as a direction along the Y-axis direction from the end 5212e or 5212f to which the gap in the edge of the through hole 71 opens toward the end opposite to the end 5212e or 5212f to which the gap in the edge of the through hole 71 does not open in each elongated portion 5212. By doing so, each through hole 71 might not have an upstream edge (refer to FIGS. 10 and 11) in the moving direction D where blurring is likely to occur. Consequently, this may reduce difficulty in detection of the marks 72 that may be hardly identified due to intrusion of the material 110 into the through holes 71.

Modifications

While the disclosure has been described in detail with reference to the specific embodiments thereof, these are merely examples, and various changes, arrangements and modifications may be applied therein without departing from the spirit and scope of the disclosure.

In the illustrative embodiments, the through holes and the marks have a circular shape when viewed in the third direction (e.g., the Z-axis direction). Nevertheless, in other embodiments, for example, the through holes and the marks may have another shape, for example, a rectangular shape.

The positions where the through hole and the mark are defined in each elongated portion 5212 are not limited to the second region R2 (refer to FIG. 8). In other embodiments, for example, in each elongated portion 5212, the through hole and the mark may be defined in the first region R1. In each elongated portion, the center of the through hole and the center of the mark may be on the center line that extends in the first direction and passes the center of the elongated portion. The through hole and the mark might not necessarily be provided on both of the elongated portions.

The marks may be formed by a method other than the screen printing. The marks may include material different from the material used for the electrode layers.

Figure 13:
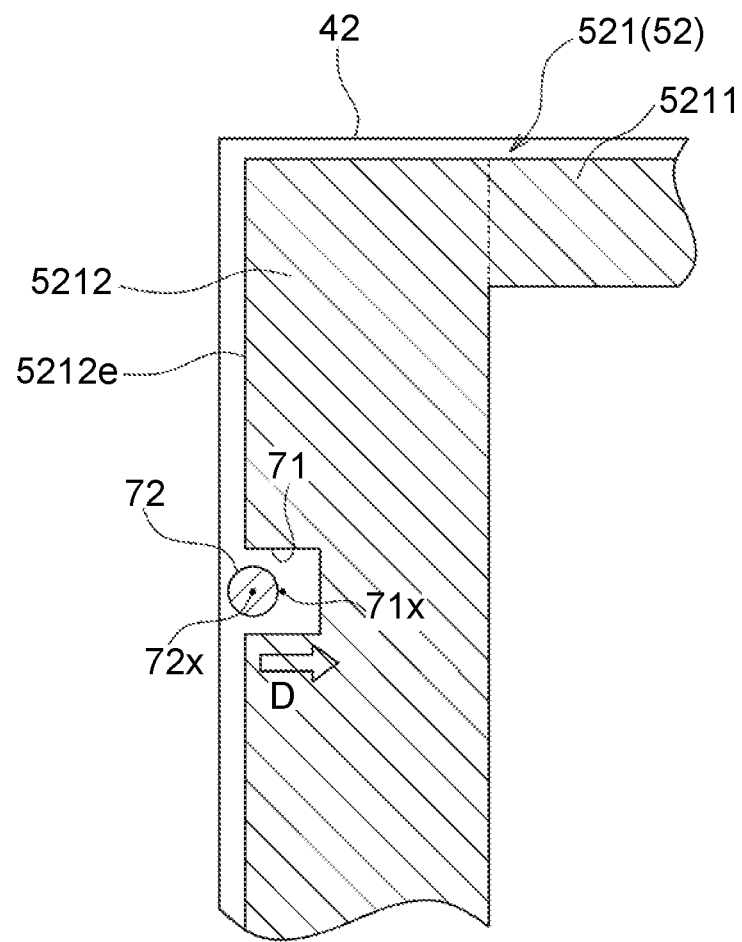
FIG. 13 is an enlarged view of a particular portion XIII of the piezoelectric actuator of FIG. 12 according to a modification of the second illustrative embodiment of the disclosure.

The center of the mark and the center of the through hole may coincide with each other. In particular, in the second illustrative embodiment (refer to FIG. 12), each through hole 71 does not have the upstream edge (refer to FIGS. 10 and 11) in the moving direction D where blurring is likely to occur. Thus, burring may be less likely to occur at the edge of the through hole 71, and therefore, the center of the mark and the center of the through hole may coincide with each other. In other embodiments, for example, as illustrated in FIG. 13, the center 72x of the mark 72 may be positioned upstream from the center 71x of the through hole 71 in the moving direction D of the squeegee 100. In this case, each through hole 71 may have, for example, a rectangular shape.

In the illustrative embodiments, the high potential electrode 52 corresponds to the first electrode layer. The high potential electrode may be disposed on the surface of the piezoelectric layer 42 and may be a middle layer of the piezoelectric layers 41, 42, and 43. Nevertheless, in other embodiments, for example, the low potential electrode 42 may correspond to the first electrode layer. The low potential electrode 42 may be disposed on the surface of the piezoelectric layer 43 that may be a lowest layer of the piezoelectric layers 41, 42, and 43. In this case, the low potential electrode 53 may have the through holes 71 and the marks 72.

In the illustrative embodiment, the piezoelectric actuator includes three piezoelectric layers. Nevertheless, in other embodiments, for example, the piezoelectric actuator may include less or more piezoelectric layers.

The disclosure may be applied to not only a printer but also a facsimile machine, a copying machine, or a multifunction device. Further, the disclosure may be applied to other liquid ejection devices used for purposes other than image recording. For example, the disclosure may be applied to a liquid ejection device configured to form conductive patterns on a surface of a substrate by ejecting conductive liquid onto the substrate. The piezoelectric actuator according to the disclosure may be applied to another apparatus or device other than a liquid ejection apparatus.

What is claimed is:

1. A piezoelectric actuator comprising:
a first piezoelectric layer; and
a first electrode layer disposed on a surface of the first piezoelectric layer, the first electrode layer including:
    a trunk portion; and
    a plurality of branch portions branched from the trunk portion,
wherein the trunk portion includes:
    a plurality of junction points from each of which a corresponding branch portion of the plurality of branch portions is branched;
    an end spaced from the plurality of junction points; and
    a first through hole positioned between the plurality of junction points and the end of the trunk portion, and
wherein a first mark is positioned inside the first through hole.

2. The piezoelectric actuator according to claim 1, wherein a center of the first mark is offset from a center of the first through hole.

3. The piezoelectric actuator according to claim 1,
wherein the first through hole is defined by an edge of the first electrode layer, and
wherein the edge defining the first through hole has a gap that opens to a particular end of the first electrode layer.

4. The piezoelectric actuator according to claim 3,
wherein the trunk portion further includes:
    a first elongated portion from which the plurality of branch portions are branched and that extends in a first direction along the surface of the first piezoelectric layer;
    a second elongated portion connected to one end of the first elongated portion in the first direction and extends in a second direction along the surface of the first piezoelectric layer, wherein the second direction intersects the first direction;
    a third elongated portion connected to the other end of the first elongated portion in the first direction and extends in the second direction along the surface of the first piezoelectric layer; and
    a second through hole positioned between the plurality of junction points and the end of the trunk portion,
wherein the second elongated portion has the first through hole and the first mark and the third elongated portion has the second through hole and a second mark,
wherein the second elongated portion has one end and the other end opposite to each other in the first direction, and the one end of the second elongated portion is farther from the first elongated portion than the other end of the second elongated portion from the first elongated portion in the first direction,
wherein the third elongated portion has one end and the other end opposite to each other in the first direction, and the one end of the third elongated portion is closer to the first elongated portion than the other end of the third elongated portion to the first elongated portion in the first direction,
wherein the gap in the edge defining the first through hole opens to the one end of the second elongated portion, and
wherein the second through hole is defined by a further edge of the first electrode layer, and the further edge defining the second through hole has a gap that opens to the one end of the third elongated portion.

5. The piezoelectric actuator according to claim 1,
wherein the trunk portion further includes:
    a first elongated portion from which the plurality of branch portions are branched and that extends in a first direction along the surface of the first piezoelectric layer;
    a second elongated portion connected to one end of the first elongated portion in the first direction and extends in a second direction along the surface of the first piezoelectric layer, wherein the second direction intersects the first direction;
    a third elongated portion connected to the other end of the first elongated portion in the first direction and extends in the second direction along the surface of the first piezoelectric layer; and
    a second through hole positioned between the plurality of junction points and the end of the trunk portion, and
wherein the second elongated portion has the first through hole and the first mark and the third elongated portion has the second through hole and a second mark.

6. The piezoelectric actuator according to claim 5,
wherein, in the second elongated portion, the first through hole is located such that a center of the first through hole is positioned between a center line and the one end of the second elongated portion in the first direction, and the center line passes a center of the second elongated portion and extends in the first direction, and
wherein, in the third elongated portion, the second through hole is located such that a center of the second through hole is positioned between a center line and the other end of the third elongated portion in the first direction, and the center line passes a center of the third elongated portion and extends in the first direction.

7. The piezoelectric actuator according to claim 4,
wherein, in the second elongated portion, the first mark is positioned between one end portion of the second elongated portion in the second direction and a midpoint of the second elongated portion in the second direction, and the one end portion of the second elongated portion in the second direction is connected to the first elongated portion, and
wherein, in the third elongated portion, the second mark is positioned between one end portion of the third elongated portion in the second direction and a midpoint of the third elongated portion in the second direction, and the one end portion of the third elongated portion in the second direction is connected to the first elongated portion.

8. The piezoelectric actuator according to claim 4,
wherein each of the second elongated portion and the third elongated portion includes:
a first region overlapping the first elongated portion in the first direction; and
a second region not overlapping the first elongated portion in the first direction, and
wherein the first mark is positioned in the second region of the second elongated portion and the second mark is positioned in the second region of the third elongated portion.

9. The piezoelectric actuator according to claim 4, further comprising:
a second piezoelectric layer disposed on the surface of the first piezoelectric layer via the first electrode layer;
a third piezoelectric layer disposed opposite to the second piezoelectric layer with respect to the first piezoelectric layer in a third direction orthogonal to the surface of the first piezoelectric layer;
a second electrode layer disposed on a surface of the second piezoelectric layer and opposite to the first electrode layer 52 with respect to the first piezoelectric layer in the third direction; and
a third electrode layer disposed between the first piezoelectric layer and the third piezoelectric layer in the third direction,
wherein a particular portion of the second piezoelectric layer includes a first active portion sandwiched between the second electrode layer and the third electrode layer in the third direction,
wherein a further particular portion in which the first piezoelectric layer and the second piezoelectric layer overlap each other in the third direction includes two second active portions sandwiched between the second electrode layer and the third electrode layer in the third direction, and
wherein the first active portion is disposed between the second active portions in the second direction.

10. The piezoelectric actuator according to claim 1,
wherein the first mark includes the same material as material used for the first electrode layer.

11. A method of manufacturing a piezoelectric actuator including a piezoelectric layer and an electrode layer, the method comprising:
forming an electrode layer on a surface of a piezoelectric layer by screen printing in which a squeegee is moved in a moving direction along the surface of the piezoelectric layer, the electrode layer including:
a trunk portion;
a plurality of branch portions branched from the trunk portion;
a plurality of junction points from each of which a corresponding branch portion of the plurality of branch portions is branched;
an end spaced from the plurality of junction points; and
a through hole positioned between the plurality of junction points and the end of the trunk portion; and
subsequent to forming the electrode layer, forming a mark inside the through hole.

12. The method according to claim 11,
wherein in the forming the mark, the mark is formed such that a center of the mark is positioned downstream from a center of the through hole in the moving direction.

* * * * *